United States Patent [19]

Higuchi et al.

[11] 4,186,344
[45] Jan. 29, 1980

[54] FREQUENCY CONVERTER

[75] Inventors: Michio Higuchi; Masayasu Hata, both of Tokyo, Japan

[73] Assignee: Oki Electric Industry Co., Ltd., Tokyo, Japan

[21] Appl. No.: 860,459

[22] Filed: Dec. 14, 1977

[30] Foreign Application Priority Data

Dec. 27, 1976 [JP] Japan ................... 51/156280

[51] Int. Cl.² ............................................. H04B 1/50
[52] U.S. Cl. ........................................ 325/20; 343/181
[58] Field of Search ................. 325/17, 18, 20, 21, 325/22, 24; 363/157, 158; 343/179, 180, 181, 100 CS; 179/15 FD

[56] References Cited

U.S. PATENT DOCUMENTS

| 3,202,917 | 8/1965 | Kawahashi et al. | 325/20 |
| 3,825,830 | 7/1974 | O'Connor | 325/20 |
| 3,916,412 | 10/1975 | Amoroso, Jr. | 343/179 |

Primary Examiner—Benedict V. Safourek
Attorney, Agent, or Firm—Frailey & Ratner

[57] ABSTRACT

In a transmitter and receiver system, a frequency converter doubles as a transmitter local oscillator, a receiver local oscillator, and a transmitter frequency converter.

The present local oscillator is a semi-conductor oscillator such as a gunn diode or IMPAT diode, the DC power supply of which is converted to an intermediate frequency signal. The oscillator is stabilized by self injection locking by a cavity resonator connected to the output of the diode, thus the oscillating frequency is very stable. Some of the output power of the oscillator is separated for the receiving local oscillator through an isolator and an attenuator. The intermediate frequencies of a transmitter and receiver have a predetermined relationship.

6 Claims, 3 Drawing Figures

4,186,344

FREQUENCY CONVERTER

BACKGROUND OF THE INVENTION

The present invention relates to a frequency converter, in particular, to a frequency converter for the local oscillator of a super-heterodyne transmitter/receiver. According to the present invention, a single oscillator is employed as a local oscillator of a transmitter, a transmitting frequency converter of a transmitter, and a local oscillator of a receiver.

In a prior super-heterodyne transmitter/receiver, separate local oscillators are utilized for the transmitter and receiver. That is to say, the first local oscillator is utilized for the transmitter, and the second local oscillator for the receiver. The local oscillator is very expensive in a wireless device, in particular, a local oscillator for frequencies higher than the UHF band, since many coaxial cables and/or waveguides must be utilized, heavy high frequency components must be utilized, and the manufacturing cost becomes high.

Accordingly, a basic local system having a single local oscillator for both a transmitter and a receiver has been proposed. However, a prior single local oscillator system has the disadvantage that the center frequency of a transmitter oscillator is altered by the modulation signal, and the fluctuation of the transmitter oscillator causes cross-talk in a receiver.

SUMMARY OF THE INVENTION

It is an object, therefore, of the present invention to overcome the disadvantages and limitations of prior frequency converters by providing a new and improved frequency converter, having a single local oscillator for both the transmitter and the receiver.

According to the present invention, the oscillation and the modulation are performed simultaneously by a single semi-conductor oscillator, and the frequency difference between the transmitting frequency and the receiving frequency is the sum of the transmitting intermediate frequency and the receiving intermediate frequency. The local oscillator stabilized by self injection locking is not only transmitted but also divided as a receiving local frequency.

The above and other objects are attained by a frequency converter having a single local oscillator, a DC power supply for operating said oscillator, said DC power supply being superposed with the transmission base band signal, a resonator connected to the output of said oscillator to provide injection locking to the oscillator, an isolator connected to the output of said resonator to extract both the local frequency and a pair of side bands in the impedance matching condition, means for transmitting one of said side bands, a mixer to receive the receiving signal and the frequency from said local oscillator to convert the receiving signal to the receiving intermediate frequency, and means for demodulating the receiving intermediate frequency to provide the receiving base band signal.

BRIEF DESCRIPTION OF THE DRAWINGS

The foregoing and other objects, features, and attendant advantages of the present invention will be appreciated as the same become better unterstood by means of the following description and accompanying drawings wherein.

DESCRIPTION OF THE PREFERRED EMBODIMENTS

Figure 1:
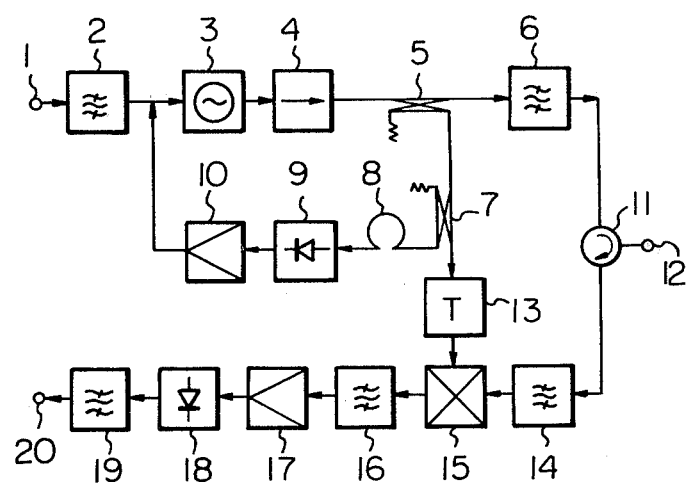
FIG. 1 is a block-diagram of a prior basic super-heterodyne transmitter/receiver.

First, a prior wireless system using a single local oscillator for both a transmitter and receiver is explained in accordance with FIG. 1 to facilitate understanding of the present invention.

In FIG. 1, the reference numeral 1 is a terminal for receiving a transmitting base band signal, 2 is a transmitting base band filter, 3 is a local oscillator and an FM (frequency modulation) modulator, 4 is an uni-guide (isolator), 5 is a directional coupler for separating local signal energy, 6 is a transmitting high frequency filter, 7 is a directional coupler for separating local signal energy for an automatic frequency control (AFC), 8 is an AFC cavity, 9 is an AFC detector, 10 is an AFC direct current amplifier, 11 is a circulator for utilizing a single antenna for both the transmitter and receiver, 12 is an antenna terminal, 13 is local signal attenuator, 14 is a high frequency receiver filter, 15 is a frequency mixer, 16 is an intermediate frequency filter, 17 is an intermediate frequency amplifier, 18 is a demodulator, 19 is a receiving base band filter, 20 is a terminal for receiving a received base band signal. An antenna and power source are not shown in FIG. 1, as they are not part of the present invention.

In FIG. 1, a base band signal to be transmitted is applied to the terminal 1, its band width is restricted by the transmitting base band filter, and it modulates the local oscillator in the FM modulator 3. The output of the FM modulator 3 passes through the isolator 4 for impedance matching, and separates a part of the local signal energy in the directional coupler 5. The output of the directional coupler 5 is applied to the antenna terminal 12 connected to an antenna (not shown), through the transmitting high frequency filter 6 for removing harmonics and undesired spurious radiation, and the circulator 11.

In the wireless system in FIG. 1, an AFC (automatic frequency control) system is utilized, since transmitting frequency accuracy of $10^{-3}$–$10^{-5}$ is required by Law and the possible system design. Accordingly, a small amount of energy is separated from the local oscillation frequency by the directional coupler 5 and the other directional coupler 7. The AFC output of the directional coupler 7 is applied to the AFC cavity, the output of which is applied to the FM demodulator (a slope detector) 9. The detector 9 provides the direct output signal, the amplitude of which is proportional to the frequency error. The frequency error is utilized to control the local oscillator 3 by adjusting the direct bias voltage of the oscillator, through the AFC direct current amplifier 10. Thus, the oscillating frequency of the local oscillator 3 is stabilized.

On the other hand, the received signal is applied to the frequency mixer 15 for converting the received frequency, through the antenna, the antenna terminal 12, the isolator 11, and the high frequency receiver filter 14 for restricting the received frequency band. The frequency mixer 15 also receives the local frequency from the oscillator 3 through the directional couplers 5 and 7 and the attenuator 13. The frequency mixer 15 mixes the received signal the local frequency and converts the received frequency to the intermediate frequency.

As explained above, the local oscillator in the basic system in FIG. 1 is common for the transmitter and the receiver, and the transmitting frequency is the same as the local frequency of the receiver. Accordingly, the difference between the transmitting frequency and the received frequency must be designed taking into consideration the intermediate frequency of the receiver. The frequency difference is determined so that the selectivity of the receiver is sufficient and the legal requirement is satisfied. Thus, the frequency difference between the transmission frequency and the received frequency is the same as the intermediate frequency of the receiver.

The intermediate signal thus converted is applied to the intermediate amplifier 17 to amplify the signal to a sufficient level for the operation of the demodulator 18, through the intermediate frequency filter 16 for restricting the received band width. The demodulator 18 demodulates the intermediate frequency signal to obtain the base band signal, which is applied to the terminal 20 through the receiving base band filter 19 for restricting the band width of the received signal. Although the intermediate amplifier 17 has an AGC (Automatic Gain Control) system, the explanation of AGC is omitted since the AGC is not the object of the present invention.

However, the wireless system in FIG. 1 has the following disadvantages. First, the transmitting base band signal leaks to the receiving circuit through a pair of directional couplers 5 and 7, the attenuator 13 and the mixer 15, and the leakage causes the cross talk in the received base band signal. The reason for that is that the time constant of the AFC loop is relatively long, while the transmitting base band signal is relatively high frequency. Said AFC loop comprises the oscillator 3, the isolator 4, the directional couplers 5 and 7, the AFC cavity 8, the AFC detector 9 and the AFC direct current amplifier 10. Although the oscillating frequency of the oscillator 3 eventually becomes equal to the resonant frequency of the cavity 8 through the AFC operation, the output frequency of the oscillator 3 fluctuates with a short period caused by the transmitting base band signal applied to the oscillator 3 through the terminal 1 and the filter 2. Further, it is impossible to shorten the time constant of the AFC loop enough to follow the change of the transmitting base band signal. Therefore, the cross talk in the received signal in the configuration of FIG. 1 is almost inevitable.

One of the proposals for overcoming the above disadvantage is to make the transmitting base band frequency different from the receiving base band frequency, and the received base band filter 19 removes the cross talk from the transmitting base band signal. Another proposal for overcoming the cross talk is to cancel the cross talk by applying the transmitting base band signal to the mixer 15 or the demodulator 18 as the transmitting base band signal can be utilized at the reception station. However, according to those proposals the construction of the device becomes complicated, so are not practical.

Further, when the transmitting base band signal leaks in the received signal, non-linear distortion caused by the non-linear characteristics of the mixer 15, the intermediate amplifier 17 and the demodulator 18 generates the interference noise in the received base band signal. As the interference noise is higher when the base band frequency is higher, the device in FIG. 1 can not be used for a high speed transmission line, on a multi-level digital transmission line.

It should be appreciated that the above discussion is applicable to the phase modulation system, the amplitude modulation system, and other modulation systems although the above explanation is in accordance with the frequency modulation system. Thus, a common local oscillator system shown in FIG. 1 has not yet been utilized, although it is economical.

The present invention overcomes the disadvantages of a prior art by completely stabilizing the oscillating frequency of a transmitter.

Figure 2:
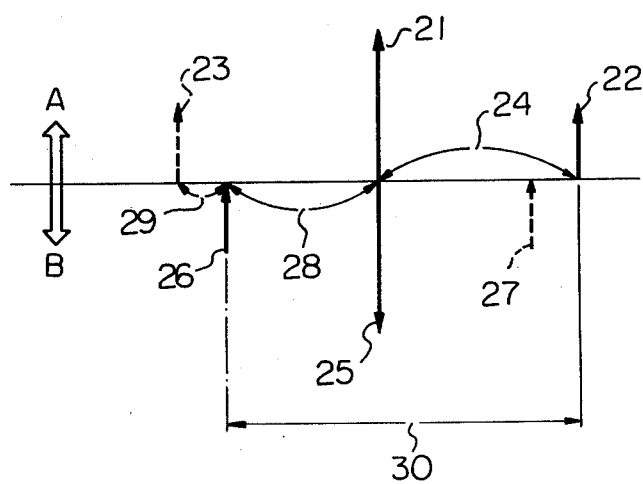
FIG. 2 shows the frequency allocation of a wireless system according to the present invention.

FIG. 2 shows the frequency allocation according to the present invention, in which the portion (A) above the horizontal line shows the frequency allocation in a transmission system, while the portion (B) under the horizontal line shows the frequency allocation in a reception system. The horizontal line in FIG. 2 shows the frequency axis.

In FIG. 2, the reference numeral 21 is a local oscillating frequency for a transmitter, 22 is a transmission frequency which is the sum of the upper side band frequency and the local frequency 21, 23 is the lower side band frequency which is generated simultaneously with the upper side band frequency by the modulator of a transmitter but the lower side band frequency is not transmitted in the present embodiment. 24 is the intermediate frequency of the transmitter. 25 is the local frequency for a receiver, and said local frequency 25 is the same as the transmission local frequency 21. 26 is a reception frequency from a slave station, and said reception frequency 26 is mixed with the receiving local frequency 25 and the upper side band frequency 27 and the lower side band frequency 26 (which is the same as the reception frequency) are obtained. 28 is the intermediate frequency of a receiver, 29 is the band width for selectivity, and 30 is the frequency difference between the transmission frequency and the reception frequency. Said frequency difference 30 is usually determined by the integer multiple of the difference of each channel because of legal requirements.

In a system design of a wireless system, the frequency band and frequency difference 30 are first determined, and next the transmission frequency 22 and the reception frequency 26 are determined relating to the frequency difference 30. Concerning the local frequency 21 (or 25), it is determined so that there is a difference 29 between the transmission intermediate frequency and the receiving intermediate frequency. That is to say, the frequency difference 29 is equal to the difference between the transmission lower side band frequency 23 and the receiving frequency 26. And the high frequency filter is so designed that the filter passes the receiving frequency 26 but does not pass the transmission lower side band frequency 23. Due to the presence of the difference between the intermediate frequencies of the transmission frequency and the reception frequency, the present wireless system does not suffer from interference noise or cross talk.

Figure 3:
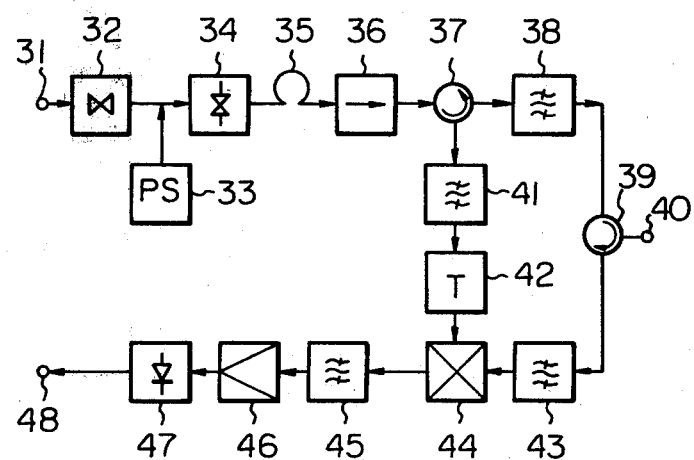
FIG. 3 is a block-diagram of a transmitter/receiver using the frequency converter according to the present invention.

FIG. 3 shows the block diagram of the transmitter/receiver according to the present invention. In the figure, the reference numeral 31 is a terminal for transmitting base band signal input, 32 is a converter for the conversion of the base band signal to the intermediate frequency, 33 is a power supply of a local oscillator, 34 is a local oscillator, 35 is a cavity resonator, 36 is an isolator for impedance matching between the local oscillator and the high frequency circuit, 37 is a circulator for separating the local frequency for the use of the local frequency of a receiver, 38 is a transmission high frequency filter, 39 is a circulator for using a single antenna for both the transmitter and the receiver, 40 is an antenna terminal, 41 is a filter for obtaining a pure local frequency, 42 is an attenuater for the attenation of the local signal, 43 is a receiving high frequency filter, which is so designed that the filter 43 passes the receiving frequency 26 (FIG. 2) but does not pass the transmission lower side band frequency 23 (FIG. 2). The reference numeral 44 is a frequency mixer, 45 is a receiving intermediate filter, 46 is an intermediate amplifier, 47 is a demodulator, and 48 is a terminal for receiving a base band signal output. The structure of an antenna, power source and an amplifier is not shown in FIG. 3 since they are of no concern to the present invention.

Now, the operation of the apparatus in FIG. 3 is explained below.

The base band signal to be transmitted applied to the terminal 31 is converted to the intermediate frequency by the converter 32. In this process, the intermediate frequency is modulated by the phase modulation system according to the base band frequency. The output of the converter 32, which is a phase modulation signal, is applied to the local oscillator 34, which also receives the DC bias voltage from the power supply 33. Therefore, the input voltage of the local oscillator 34 is the sum of the phase modulation signal and the bias voltage. The local oscillator 34 is, in the present embodiment, composed of a gunn diode or an IMPAT (Impact avalanche transmit time) diode. It has been well known in the art that such diodes provide micro-wave energy by applying a DC voltage or DC current to the diode. The output frequency of the local oscillator 34 is self-injection-locking by the use of the cavity resonator 35, and so the local frequency is completely the same as the resonance frequency of the cavity 35. Self-injection-locking system using a gunn diode or an IMPAT diode is well known in the art, that is to say, among many frequency components generated by the oscillator 34, the frequency equal to the resonance frequency of the cavity 35, is reflected by the cavity 35 because of the mismatch of the impedance between the oscillator 34 and the cavity at the resonant frequency. The reflected energy by the cavity 35 returns to the oscillator 34, and the reflected energy locks the oscillation frequency of the oscillator to the reflected frequency. As the time constant of the self-injection-locking system is very short, the self locked frequency is not affected by the base band signal and is completely the same as the resonant frequency of the cavity. In an actual operation, the bias voltage or bias current applied to the oscillator is overlapped with the phase modulated intermediate signal from the converter 32. And in this case, the oscillator 34 generates not only the resonant frequency but also the side bands generated through the non-linear characteristics of the oscillator. Therefore, the upper side band 27 and the lower side band 26 shown in FIG. 2 are obtained from the oscillator 34. It should be appreciated that the value of Q of the cavity resonator 35 is so designed that the self-locking is effective only to the center frequency of the oscillator 34 and not for the side-band frequencies.

According to the embodiment of the present invention in which the frequency band is 40 $GH_z$ and the value of Q of the cavity 35 is 10,000, the reflection energy from the cavity to the oscillator is 3 dB, the residual change of the amplitude of the output of the cavity is 3% compared with the case that the self-injection-locking system were not used, and the residual frequency change in the FM or PM mode at the output of the cavity is only 1% of the case where the self-injection-locking system is not used. As the effect of the self locking is limited only to the center frequency, the noise, distortion and frequency stability of the center frequency are improved, but the side band frequencies 26 and 27 are not affected by the self locking system.

As explained above, the local oscillator 34 which receives the bias voltage (or current) overlapped with the phase modulated intermediate signal, generates the local frequency 21 and 25 for both transmission and reception, the upper side band frequency 22, and the lower side band frequency 23, simultaneously.

The output of the cavity 35 comprising the frequencies 21, 22 and 23 is applied to the isolator 36, which effects the impedance matching between the oscillator system including the oscillator 34 and the cavity 35, and the circuit outside the oscillator system. The output of the isolator 36 is applied to the circulator 37, which separates the local frequency component. Said local frequency component is applied to the receiving frequency mixer 44 through the band pass filter and the attenuator 42. It should be appreciated of course that the center frequency of the band pass filter 41 is the same as the center frequency (21 or 25) of the oscillator 34. The rest of the output of the circulator 37 is applied to the transmission high frequency filter 38, the operational frequency of which is designed equal to the upper side band 22. Therefore, only the upper side band frequency 22 can pass the filter 38, and said upper side band frequency is applied to an antenna through the circulator 39 and the antenna terminal 40. It should be appreciated of course that the intermediate frequency is considerably higher than the frequency of the base band signal, therefore the change of the upper side band frequency 22 due to the change of the frequency of the base band signal can be obviated, thus the filter 38 can always pass the upper side band frequency although the upper side band frequency is changing because of modulation.

On the other hand, the received signal from the antenna is applied to the frequency mixer 44 through the antenna terminal 40, the circulator 39 and the receiving high frequency filter 43. It should be appreciated that the frequency mixer 44 receives the local frequency signal generated by the local oscillator 34 through the cavity 35, the isolator 36, the circulator 37, the filter 41, and the attenuater 42. Thus, the received signal and the local frequency signal are mixed, and the received signal frequency is converted to the intermediate frequency. It should be appreciated that the local frequency generated by the oscillator 34 is a pure stable frequency having no distortion and no noise, and is not modulated by the transmission base band signal, since the local frequency is stabilized through the self-locking system mentioned above. Accordingly, the received signal does not suffer from cross talk from the transmission signal.

The intermediate signal, which is the output of the mixer 44, is applied to the filter 45 which selects only the desired signal, and the output of the filter 45 is applied to the demodulator 47 through the amplifier 46, in which the AGC (Automatic Gain Control) is accomplished. The demodulator 47 demodulates the intermediate signal and provides the receiving base band signal to the terminal 48.

Since there is an empty band space 29 (FIG. 2) between the transmission lower side band frequency 23 and the receiving frequency 26, the transmission lower side band frequency 23 is attenuated by the filters 41 and 45 by more than 100 dB, so that the transmission lower side band frequency 23 can not reach the demodulator 47. Similarly, the received signals from other wireless systems are attenuated by the filters 43 and 45 by more than 80 dB, so the present system does not suffer from noise generated by interference with other systems.

Some of the embodiments of the present invention will be enumerated below.

According to the first embodiment, the features are shown below.

Frequency band; 38–40 $GH_z$
Frequency difference between the transmission frequency and the receiving frequency; 700 $MH_z$
Transmission power; 10 mW
Transmission conversion efficiency (the ratio of the intermediate frequency power applied to the oscillator 34 and the high frequency power obtained at the output of the oscillator 34); 0 − −5 dB
Transmission speed of the base band signal; 6.3 Mb/sec According to the second embodiment of the present invention, the transmission intermediate frequency is lower than the receiving intermediate frequency. In the first embodiment it is clear from FIG. 2, that the transmission intermediate frequency 24 is higher than the receiving intermediate frequency 28. In the second embodiment, the design of the transmission frequency, the receiving frequency and the intermediate frequency must be changed, and the operational frequencies of the converter 32, the filter 38, the filter 43, and the filter 45 in FIG. 3 must be changed accordingly.

According to the third embodiment of the present invention, the frequency difference 29 between the transmission lower side band frequency and the receiving frequency is omitted and is replaced by the frequency difference between the transmission frequency and the receiving frequency. In this case, the local frequency 21 (and 25) is the same as that in the above embodiments, but the transmission frequency and the receiving frequency are designed to be 22 and 27, respectively, or 23 and 26, respectively. That is to say, both the transmission frequency and the receiving frequency are designed to locate at a single side (upper side or lower side) of the local frequency. The third embodiment can be accomplished only by changing the operational frequency of the filters 38 and 43.

As explained above in detail, according to the present invention, a single local oscillator can double as a transmission local oscillator and a receiving local oscillator. Therefore, a single oscillator 34 and a mixer 44 are the only active elements in the high frequency sections of both the transmitter and the receiver. As a prior wireless system must have four active elements in high frequency sections, (in the transmission local oscillator, transmission frequency converter, receiving local oscillator, and receiving frequency converter), the active elements in the present invention can be half in number of those in a prior art. Since the manufacturing cost of the high frequency sections is more than 67% of the total costs of a wireless system, the present invention can reduce the manufacturing costs of a wireless system even by 30%. Further, the reliability of high frequency active element such as millimeter waves is worse than that in the UHF band, therefore, the present invention can improve the reliability of a wireless system by decreasing the number of active elements in the high frequency sections. In a prior art, the reliability of an entire wireless system depends upon the high frequency sections of the same by 70–80%.

As the present invention can reduce the number of active elements in high frequency section, the reliability of the system can be doubled, and the size, the weight, and the power consumption can also be reduced.

Further, as mentioned above, the present invention can provide a high quality transmission system, since the cross talk from the transmission side to the receiving side within the station can be eliminated.

Therefore, the present invention is applicable to the electronics communication field, wireless transmission field, and/or measuring instruments field.

From the foregoing it will now be apparent that a new and improved frequency converter has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A frequency converter comprising a single diode oscillator,
   a DC power supply being superposed with the intermediate frequency signal,
   a cavity resonator connected to the output of the diode oscillator for providing self-injection-locking to the diode oscillator,
   means connected to the output of said resonator to extract both the local frequency for the receiver and a pair of side bands,
   means for transmitting one of said side bands,
   a mixer to receive the receiving signal and said local frequency to convert the receiving signal to the receiving intermediate frequency, and
   means for demodulating the receiving intermediate frequency to provide the receiving base band signal.

2. A frequency converter according to claim 1 in which said cavity resonator is directly connected to the output of the diode oscillator.

3. A frequency converter according to claim 2 in which said local oscillator comprises a gunn diode.

4. A frequency converter according to claim 2 in which said local oscillator comprises an IMPAT diode.

5. A frequency converter according to claim 2, wherein said means connected to the output of said resonator to extract both the local frequency for the receiver and a pair of side bands comprises a circulator for separating a local frequency from the transmission signal for said mixer.

6. A frequency converter according to claim 3, wherein an attenuator is provided between said circulator and the mixer.

* * * * *